United States Patent [19]
Oh et al.

[11] Patent Number: 5,854,563
[45] Date of Patent: Dec. 29, 1998

[54] PROCESS CONTROL MONITORING SYSTEM AND METHOD THEREFOR

[75] Inventors: Sung-Hun Oh, Phoenix; Richard Ulmer, Tempe, both of Ariz.

[73] Assignee: VLSI Technology, Inc., San Jose, Calif.

[21] Appl. No.: 684,964

[22] Filed: Jul. 19, 1996

[51] Int. Cl.⁶ ............................. H03K 5/153; H03K 5/22
[52] U.S. Cl. ................... 327/74; 327/68; 327/83
[58] Field of Search .................... 327/74, 68–71, 327/75, 78, 79, 83, 53, 77, 80, 81, 538, 539, 540, 541, 362; 323/315; 330/257, 288

[56] References Cited

U.S. PATENT DOCUMENTS

| | | | |
|---|---|---|---|
| 5,099,192 | 3/1992 | Thayer et al. ............................ | 323/315 |
| 5,130,582 | 7/1992 | Ishihara et al. ......................... | 327/262 |
| 5,163,021 | 11/1992 | Mehrotra et al. ....................... | 365/185 |
| 5,204,612 | 4/1993 | Lingstaedt .............................. | 323/315 |
| 5,508,958 | 4/1996 | Fazio et al. ............................. | 365/168 |

FOREIGN PATENT DOCUMENTS

| | | | |
|---|---|---|---|
| 55-134536 | 10/1980 | Japan ...................................... | 327/75 |

*Primary Examiner*—Timothy P. Callahan
*Assistant Examiner*—Eunja Shin
*Attorney, Agent, or Firm*—Harry M. Weiss; Jeffrey D. Moy; Harry M. Weiss & Associates, P.C.

[57] ABSTRACT

The present invention relates to a process control monitoring system and method. The system and method uses current comparator circuits for monitoring process changes. Process sensitive current sources are compared with weighted reference current sources in a manner that each output of the current comparators demonstrates the inequality of the current sources. By setting the weighted reference current sources properly, the outputs of the current comparators may be used to locate the process corner of the fabricated integrated circuit.

39 Claims, 3 Drawing Sheets

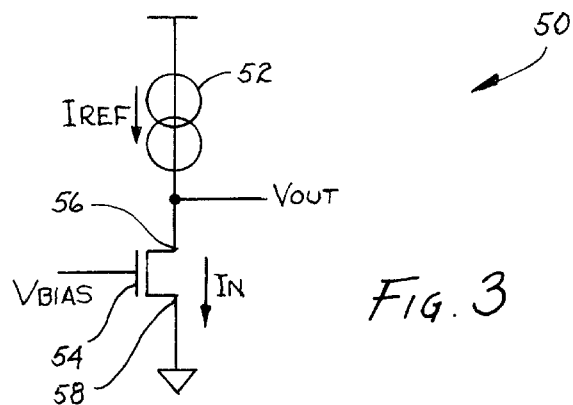
FIG. 3
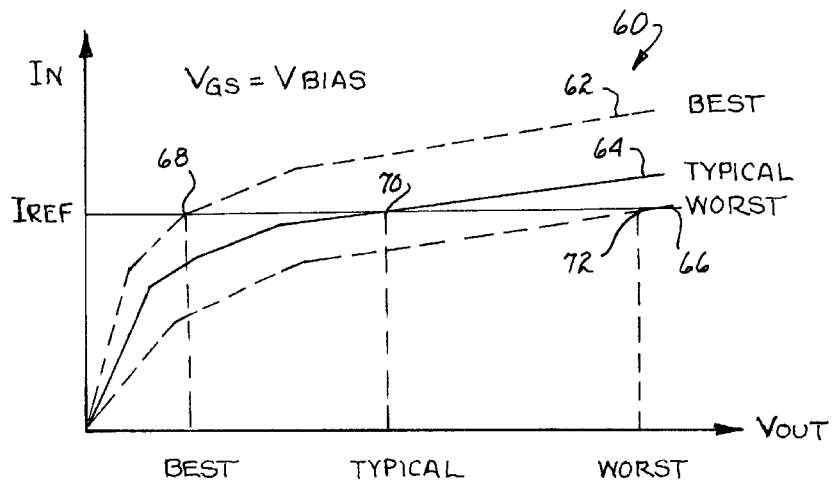
FIG. 4
| NMOS CURRENT | A0 | A1 | A2 |
|---|---|---|---|
| 0.5 IREF | H | H | H |
| 0.7 IREF | H | H | H |
| 0.9 IREF | L | H | H |
| 1.1 IREF | L | L | H |
| 1.3 IREF | L | L | L |
| 1.5 IREF | L | L | L |
FIG. 5

PROCESS CONTROL MONITORING SYSTEM AND METHOD THEREFOR

BACKGROUND OF THE INVENTION

1. Field of the Invention

This invention relates to integrated circuits and, more specifically, to a process control monitoring system and method which uses a plurality of current comparator circuits for monitoring process variations.

2. Description of the Prior Art

Integrated circuits (ICs) are produced with inherent variations in their performance characteristics. These variations are the result of minor changes in conditions during the fabrication process from product lot to product lot. These variations have lead to the production of IC devices which have a statistically normalized range of electronic performance characteristics. The IC electronic characteristics vary depending on the variations present in the fabrication process. External factors such as the temperature of the device and/or operating power supply voltage/current variations may also contribute to the magnitude of the performance variations from the norm.

The character and magnitude of the IC performance variations are different from product lot to product lot. Threshold voltages, channel lengths, dopant levels, and the like, are all fabrication process variables which statistically vary some range above and below the desired specifications. These variations cause difficulties in extracting optimum performance from the fabricated IC devices.

Some semiconductor devices are affected to a greater degree than others. In particular, current drive strength in output buffers have been vary problematic. Variations in the components of the output buffer have lead to mismatches in buffer impedance (i.e., buffer driver strength). For example, in an output buffer, an equivalent output resistance change, due to variations in output driver strength, often generates different reflection behaviors in transmission lines. This makes transmission line termination schemes ineffective. Furthermore, an over designed transistor for a worst case scenario will cause an increase in switching noise at nominal operating levels and possible device malfunction at extreme deviations from the nominal operation levels. Thus, an output buffer which produces a substantially constant current drive strength which is insensitive to process variations is highly desirable.

Several attempts have been made in order to produce an output buffer which provides a substantially constant current drive strength. Digital solutions based on delay time or charging time measurements have been proposed. In accordance with one approach, a ring oscillator is constructed onto the die of a fabricated device such that the ring oscillator shares the same characteristics of the fabricated device. The frequency of oscillation of the ring oscillator is then measured. Slow oscillation indicates weak transistors, while fast oscillation indicates strong transistors. Adjustments to the IC are made accordingly using control signals from digital logic. Analog approaches which use timing schemes have also been proposed.

The process control monitoring systems of the prior art have numerous drawbacks. First, the measurement circuits used in the digital systems are complicated and tricky to design. Furthermore, the prior art digital systems consume large amounts of power and occupy a significant amount of area on the IC due to the large amount of digital logic that is required. The prior art analog approaches are no better. The power consumption of the prior art analog systems would prohibit their use to drive busses. Furthermore, the analog approaches would also consume large amounts of area on the IC.

Therefore, a need existed to provide an improved process control monitoring system and method therefor. The improved system and method must be able to generate signals which track process variations without dissipating a large amount of power. The improved system and method must also not require complex circuit architecture or occupy a large die area.

SUMMARY OF THE INVENTION

In accordance with one embodiment of the present invention, it is an object of the present invention to provide an improved process control monitoring system and method therefor.

It is another object of the present invention to provide an improved process control monitoring system and method which is able to generate signals which track process variations without dissipating a large amount of power, which does not require complex circuit architecture, and which does not occupy a large die area.

BRIEF DESCRIPTION OF THE PREFERRED EMBODIMENTS

In accordance with one embodiment of the present invention a process control monitoring system is disclosed. The process control monitoring system is comprised of reference current source means for generating a stable reference current. A plurality of weighted reference current source means are coupled to the reference current source means for receiving the stable reference current and for generating a plurality of weighted reference currents. A plurality of current comparator means are provided wherein each of the plurality of current comparator means has a variable input signal and is individually coupled to a separate one of the plurality of weighted reference current source means for providing an output voltage corresponding to the weighted reference current source means coupled thereto and the variable input signal. A plurality of control signal means may be provided wherein a single control signal means is individually coupled to a separate output of each of the plurality of current comparator means for converting the output voltage of each of the current comparator means to a discrete control signal.

In accordance with another embodiment of the present invention, another process control monitoring system is disclosed. The process control monitoring system is comprised of reference current source means for generating a stable reference current. A plurality of nominal current source means are coupled to the reference current source means for receiving the stable reference current and for generating a plurality of nominal currents. A plurality of weighted current comparator means are provided wherein each of the plurality of weighted current comparator means has a variable input signal and is individually coupled to a separate one of the plurality of nominal current source means for providing an output voltage corresponding to the nominal current source means coupled thereto and the variable input signal. A plurality of control signal means are provided wherein each of the plurality of control signal means are individually coupled to a separate output of each of the plurality of weighted current comparator means for converting the output voltage of each of the weighted current comparator means to a discrete control signal.

In accordance with another embodiment of the present invention, a process control monitoring method is disclosed. The method comprises the steps of: generating a stable reference current from a reference current source; providing a plurality of weighted reference current source means coupled to the reference current source for receiving the stable reference current and for generating a plurality of weighted reference currents; and providing a plurality of current comparator means each of the plurality of current comparator means having a variable input signal and is individually coupled to a separate one of the plurality of weighted reference current source means for providing an output voltage corresponding to said weighted reference current source means coupled thereto and the variable input signal of the current comparator means. The method may further comprise the step of providing a plurality of control signal means individually coupled to a separate output of each of the plurality of current comparator means for converting the output voltage of each of the current comparator means to a discrete control signal.

In accordance with still another embodiment of the present invention, another process control monitoring method is disclosed. The method comprises the steps of: generating a stable reference current from a reference current source; providing a plurality of nominal current source means coupled to the reference current source for receiving the stable reference current and for generating a plurality of reference currents; and providing a plurality of weighted current comparator means each of the plurality of weighted current comparator means having a variable input signal and is individually coupled to a separate one of the plurality of nominal current source means for providing an output voltage corresponding to the nominal current source means coupled thereto and the variable input signal. The method may further comprise the step of providing a plurality of control signal means individually coupled to a separate output of each of the plurality of weighted current comparator means for converting the output voltage of each of the weighted current comparator means to a discrete control signal.

The foregoing and other objects, features, and advantages of the invention will be apparent from the following, more particular, description of the preferred embodiments of the invention, as illustrated in the accompanying drawing.

BRIEF DESCRIPTION OF THE DRAWINGS

FIG. 3 is a schematic of a current comparator used in the process control monitoring system depicted in FIG. 2.

FIG. 4 is a plot diagram showing electrical current versus output voltage for the current comparator depicted in FIG. 3.

FIG. 5 is a logical truth table of the control signal outputs from the process control monitoring system depicted in FIG. 2.

DETAILED DESCRIPTION OF THE PREFERRED EMBODIMENT

Figure 1:
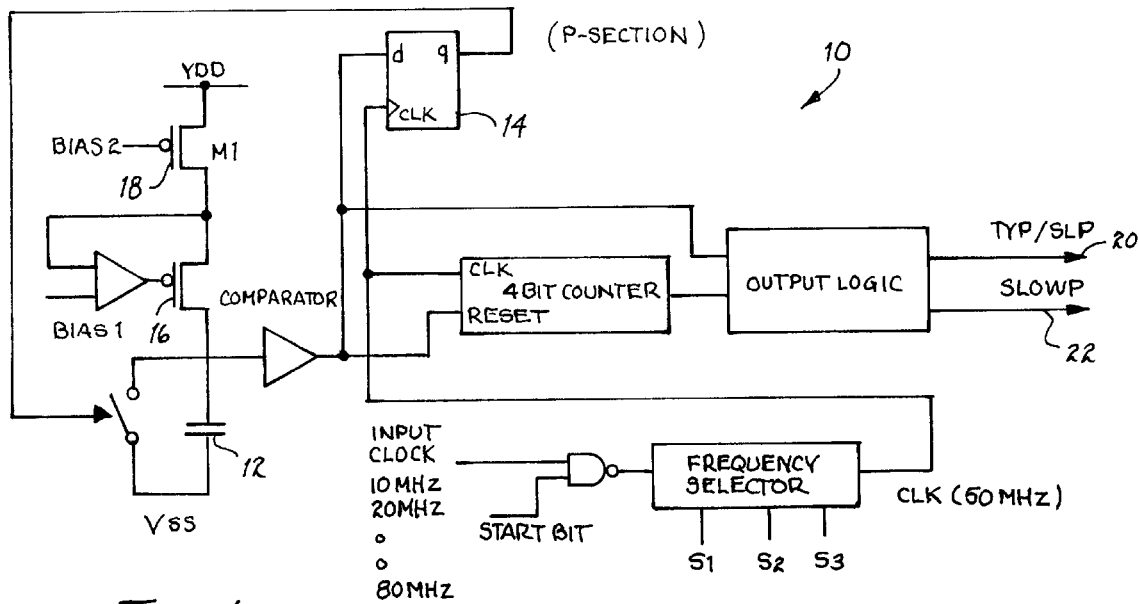
FIG. 1 is a simplified schematic of a prior art process control monitoring system.

Referring to FIG. 1, a prior art process control monitoring system 10 (hereinafter system 10) is shown. The system 10 uses a timing scheme to produce an output buffer which provides a substantially constant current drive strength. In system 10, a capacitor 12 is charged and delay measurements are taken. The time interval for charging or discharging the capacitor 12 is measured by a flip-flop 14. Because the transistors 16 and 18 and the charging capacitor 12 are similar in type and location to transistors comprising the rest of the integrated circuit (IC) device, the measured time interval indicates a nominal strength of the entire circuit. In the case of an output buffer, control signals 20 and 22 are used to configure the entire circuit to compensate for variations in circuit strength and impedance. The system 10 is used to measure P channel enhanced metal oxide semiconductor (PMOS) devices. The system 10 must be duplicated to monitor process variations for N channel enhanced metal oxide semiconductor (NMOS) devices. As can be seen from FIG. 1, system 10 is a fairly complex system and would consume large amounts of area on the IC. Thus, system 10 is not economically practicable to use.

Figure 2:
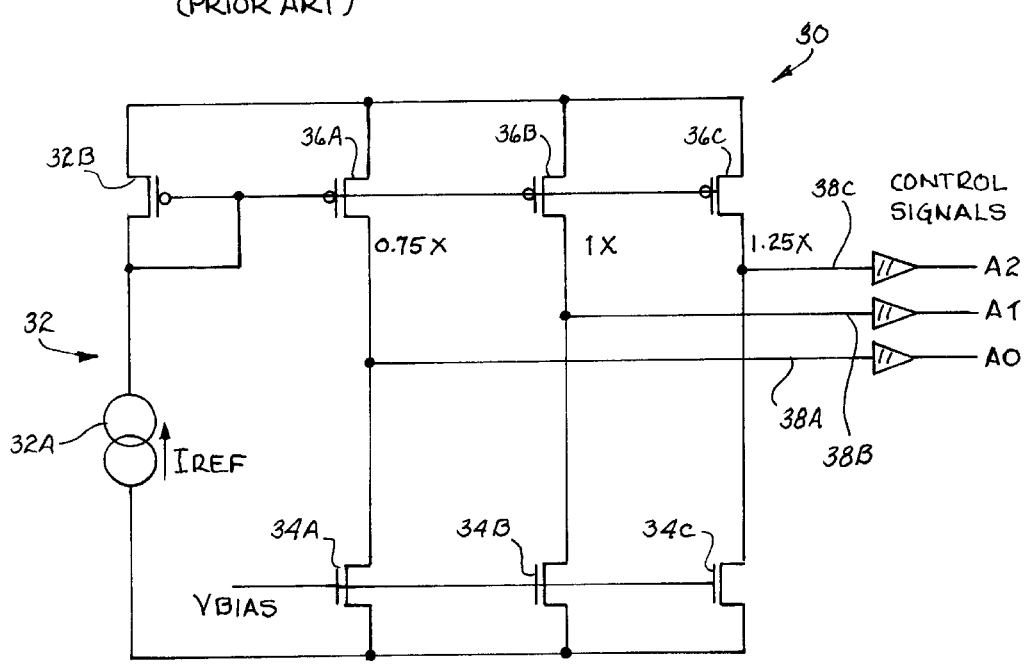
FIG. 2 is a simplified schematic of the process control monitoring system of the present invention.

Referring now to FIG. 2, an improved process control monitoring system 30 (hereinafter system 30) is shown. The system 30 is able to monitor the variations of circuit element characteristics as a result of normal semiconductor fabrication process variations. The electrical characteristics of a semiconductor device are said to indicate which "process corner" the device is located. The term "process corner" refers to the strength of the device with respect to the optimal or expected strength of the device.

The system 30 is comprised of a plurality of current comparators. In order to more clearly describe the structure and operation of the system 30, one must understand the structure and operation of a current comparator. Thus, a description of a single current comparator is discussed below.

Referring now to FIG. 3, a single current comparator 50 is shown. The current comparator is comprised of a reference current circuit 52. The reference current circuit 52 provides a reference current $I_{REF}$ which is used to compete with a current of a device under test (DUT) 54. In the preferred embodiment, the DUT 54 is representative of all similar transistors on the IC. The DUT 54 is physically proximate to other similar devices physically integrated onto the IC. However, proximate co-location on the same die is not an absolute requirement. The only requirement is that the DUT 54 is from the same family of fabrication process variation, or from the same "process corner" as the devices the DUT 54 is intended to represent. This is most easily accomplished by making the DUT 54 a device on the IC being characterized.

The reference current circuit 52 is process, temperature, and power supply insensitive. The reference current $I_{REF}$ produced represents the current level of a nominal DUT in a nominal case. The arrow marked $I_N$ represents the current flowing through the DUT 54 from the drain 56 to the source 58. According to Kirchhof's law, the current comparator 50 will tend to stabilize at a point where $I_{REF}$ and $I_N$ are equal. Thus, the voltage $V_{OUT}$ will adjust in order to keep $I_{REF}$ and $I_N$ equal.

Referring to FIG. 4, a plot 60 of $I_N$ versus $V_{OUT}$ for current comparator 50 (FIG. 3) is shown. Because the DUT 54 (FIG. 3) is a sample transistor from the fabricated lot, each transistor in the lot will be affected by similar process changes. By characterizing the DUT 54, all similar transistors are characterized as they are physically proximate to each other and underwent the same fabrication process at the same time. Thus, the DUT 54 is an accurate sample of all similar devices on the IC.

Referring to FIGS. 3 and 4, at the point where $I_{REF}$ and $I_N$ are equal, $V_{OUT}$ is measured. Lines 62, 64, and 66 are sample displays of $V_{OUT}$ versus $I_N$. At point 68, on line 62, a "strong" transistor from the fabrication process variation would stabilize at the indicated $V_{OUT}$. At point 70 on line 64, a nominal transistor from the fabrication process variation would stabilize at the indicated $V_{OUT}$. At point 72 on line 66, a "weak" transistor from the fabrication process variation would stabilize at the indicated $V_{OUT}$. Thus, a "strong" transistor device stabilizes at a lower $V_{OUT}$ than a nominal device, and a "weak" transistor stabilizes at a higher $V_{OUT}$ than a nominal transistor.

Lines 62, 64, and 66 are generated by DUT 54 (FIG. 3) operating in the saturation region. However, many transistors on IC devices operate either in the cut off state or in the triode region. The performance of devices similar to the DUT 54 operating in other regions may be adequately predicted by extrapolation. The process variations are still being detected by characterizing transistors as "strong" (i.e., best case), nominal, and "weak" (worst case). Thus, $V_{OUT}$ becomes an indicator of the strength of the DUT 54 (FIG. 3).

Referring back to FIG. 3, it should be noted that in the present embodiment, the DUT 54 is an NMOS transistor. However, other types of transistors may also be used. Furthermore, in the present embodiment, reference current circuit 52 may be located either on or off the IC containing the device to be characterized, while the DUT 54 is physically integrated into the IC device being characterized.

Referring now to FIG. 2, the system 30 is comprised of a reference current circuit 32. As mentioned above, the reference current circuit 32 may be located either on or off the IC device. The reference current circuit 32 is designed to be process, temperature, and power supply voltage insensitive. The reference current circuit 32 is provided in order to generate a stable reference current $I_{REF}$. The reference current $I_{REF}$ is used to measure the response of the DUTs 34A, 34B, and 34C. The generated reference current $I_{REF}$ represents the current level of a nominal DUT in a nominal case.

In accordance with the present embodiment, the reference current circuit 32 is comprised of a current generator 32A. The current generator 32A generates the reference current $I_{REF}$. The reference current circuit 32 is further comprised of a PMOS transistor 32B which distributes the reference current $I_{REF}$ to a plurality of PMOS transistor 36A, 36B, and 36C. The PMOS transistor 32B distributes the reference current $I_{REF}$ such that the gate to source voltage $V_{gs}$ at each of the plurality of PMOS transistors 36A, 36B, and 36C stabilizes at equal values.

The PMOS transistors 36A, 36B, and 36C are weighted current source circuits. In the present embodiment, PMOS transistor 36A is weighted at 0.75 $I_{REF}$, PMOS transistor 36B is weighted at 1.0 $I_{REF}$, and PMOS transistor 36C is weighted at 1.25 $I_{REF}$. The weighted current source circuits are sized through standard semiconductor fabrication techniques. For example, sizing the PMOS transistor channel width such that their strength will be a direct ratio of the PMOS transistor or the channel length which is reversely proportional to the PMOS transistor. The weighted ratios are selected to represent nominal current flow from nominally fabricated devices and current flow from process variation extremes. A more accurate, or "granular" characterization is possible by simply adding additional weighted current source circuits. Note, it should be understood that the present invention is also well suited to using fewer or greater than the three weighted current source circuits depicted in FIG. 2. Likewise, the present invention is also well suited to using numerous other weighting ratios.

In the present embodiment, DUTs 34A, 34B, and 34C are identical transistors under test. The DUTs 34A, 34B, and 34C are representative samples of all similar transistors on the IC device. The DUTs 34A, 34B, and 34C must be within the same process corner as the IC device and must share the same electrical characteristics of all similar transistors on the IC device. As was discussed with reference to FIG. 3, the DUTs 34A, 34B, and 34C each comprise an individual current comparator circuit.

In operation when $V_{BIAS}$ is equal for DUTs 34A, 34B, and 34C, and when the weighted reference currents flow through the DUTs 34A, 34B, and 34C, the DUTs 34A, 34B, and 34C will produce a stabilized voltage output at their respective drains. The voltage output for each of the DUTs 34A, 34B, and 34C will be directly proportional to the magnitude of the weighted reference current that flows through each of the DUTs 34A, 34B, and 34C. For example, when the current flowing through the DUTs 34A, 34B, and 34C are smaller than the weighted reference currents provided from PMOS transistors 36A, 36B, and 36C, the output voltage at the drains of the DUTs 34A, 34B, and 34C will increase so that the current flow will be equal. Thus, the output voltages of each of the DUTs 34A, 34B, and 34C will be high.

The comparator outputs of each of the DUTs 34A, 34B, and 34C are coupled to control signal output circuits 38A, 38B, and 38C, respectively. The control signal output circuits 38A, 38B, and 38C convert the output voltage from each of the comparator outputs of the DUTs 34A, 34B, and 34C to discrete control signals. In the preferred embodiment of the present invention, control signal output circuits 38A, 38B, and 38C are each comprised of a latching analog to digital converter for reading the output voltage and outputting a discrete control signal.

Referring to FIG. 5, a logical truth table for the control signals of the present invention is shown. As stated above, the control signals are based on the current level flowing through the DUTs 34A, 34B, and 34C (FIG. 2). For example, when the currents passing through the DUTs 34A, 34B, and 34C becomes less than 0.75 $I_{REF}$, the control signal output circuits 38A, 38B, and 38C (FIG. 2) will convert the output voltages from each of the comparator outputs of the DUTs 34A, 34B, and 34C to high signals. When the currents are equal to 0.9 $I_{REF}$, the control output circuit 38A produces a low signal while the control output circuits 38B and 38C produces high signals. Thus the control signals, driven by the comparator outputs of the DUTs 34A, 34B, and 34C, track fabrication process variations present in the IC device.

The digital outputs can be used for, but not limited to, applications such as programmable output buffers in selecting drive strengths for controlling a current to reduce signal switching noise by lowering an unnecessary amount of current driving an output, and/or by lowering an unnecessarily high rate of current swing. Thus, unwanted changes or variations in the current driving an output, in response to environmental conditions such as temperature, overall voltage levels in electronic circuits, and manufacturing process tolerances may be tracked and eliminated.

In the present embodiment, DUTs 34A, 34B, and 34C are NMOS transistors. Where an IC contains PMOS devices, the system 10 (FIG. 2) may be modified to characterize the PMOS devices. If PMOS devices are to be characterized, the architecture illustrated in FIG. 2 remains essentially the same. The principal change is that the weighted current source circuits would be NMOS transistors instead of PMOS transistors, and the DUTs would be PMOS transistors instead of NMOS transistors.

In accordance with another embodiment of the present invention, the weighted current source circuits (i.e., PMOS transistors 36A, 36B, and 36C) are replaced with nominal current source circuits. In effect, all of the ratios would be set to 1.0 $I_{REF}$. The granularity is obtained by replacing the DUTs 34A, 34B, and 34C with weighted strength current comparators. The weighted strength current comparators would be fabricated having varying strengths with ratios of 0.75, 1.0, and 1.25 respectively. The outputs of the weighted current comparators would function in the same manner as the output of DUTs 34A, 34B, and 34C shown in FIG. 2.

Figure 6:
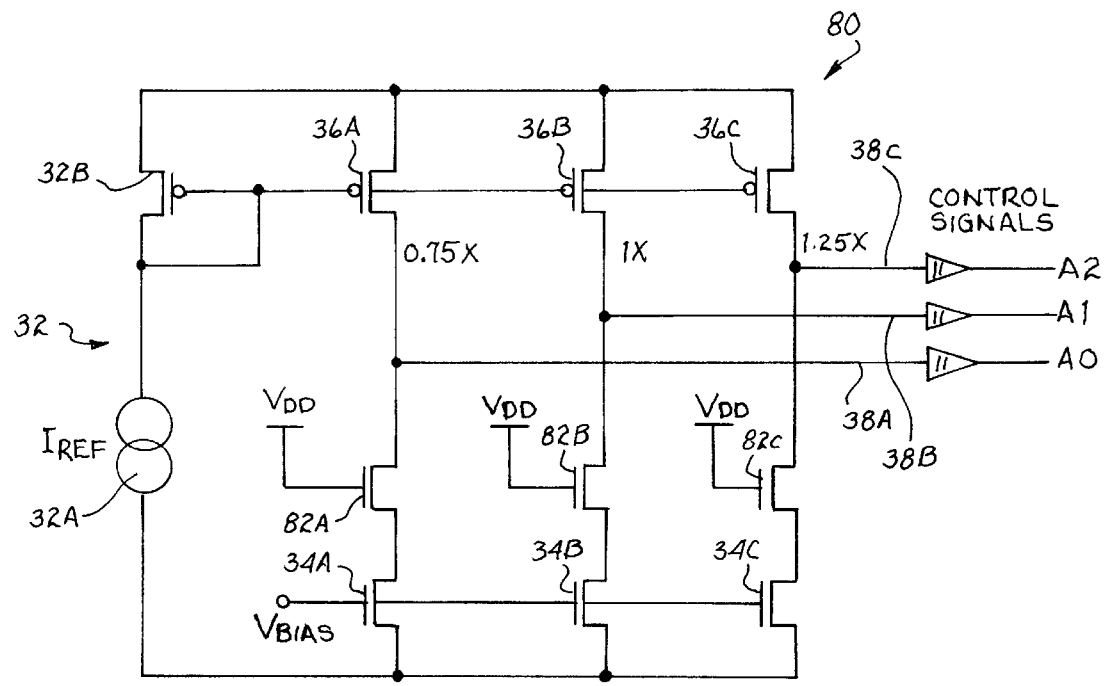
FIG. 6 is a simplified schematic of a second embodiment of the process control monitoring system of the present invention.

Referring to FIG. 6, another embodiment of the present invention is shown wherein like numerals and symbols represent like elements. The system 80 shown in FIG. 6 is basically the same as the system 30 shown in FIG. 1. The main difference between the two embodiments is that in the system 80 the current comparator outputs of the DUTs 34A, 34B, and 34C are placed in a cascode scheme. The sources of each NMOS transistors 82A, 82B, and 82C are individually coupled to a respective gate of the DUTs 34A, 34B, and 34C. The cascode scheme increases the gain of the comparator stage thereby allowing it to detect minute changes and to translate these changes to output signals.

Figure 7:
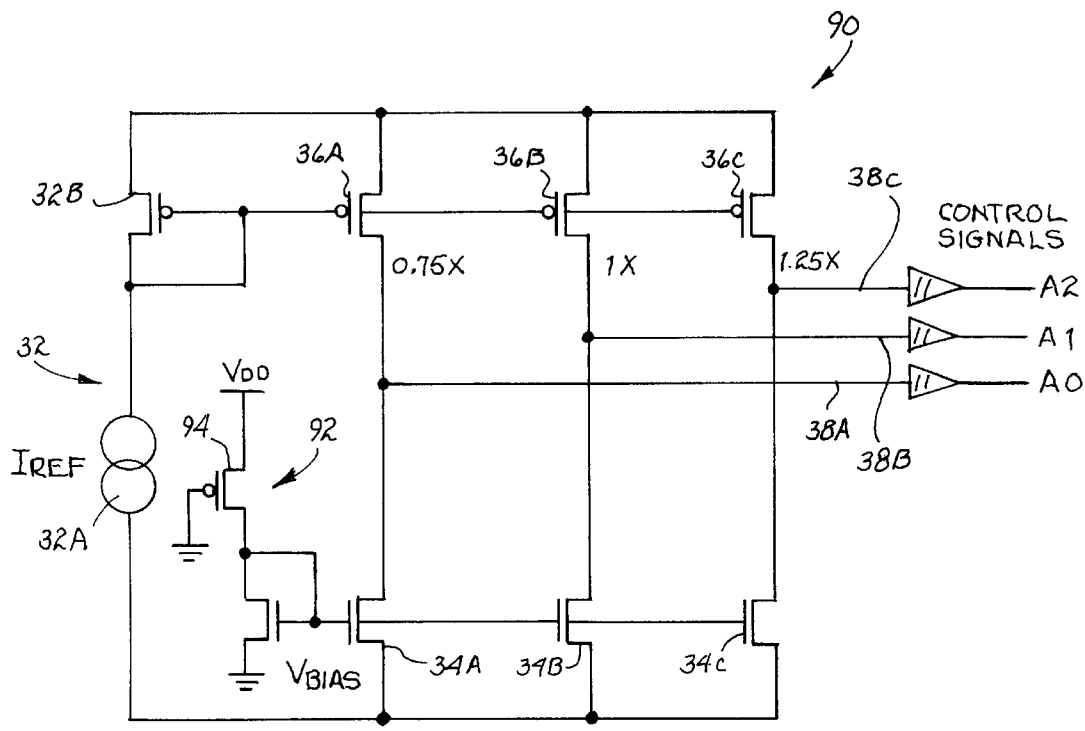
FIG. 7 is a simplified schematic of a third embodiment of the process control monitoring system of the present invention.

Referring to FIG. 7, another embodiment of the present invention is shown wherein like numerals and symbols represent like elements. The system 90 shown in FIG. 7 is basically the same as the system 30 shown in FIG. 1. The main difference between the two embodiments is that in the system 90 a current mirroring circuit 92 is coupled to the DUTs 34A, 34B, and 34C. The current mirroring circuit 92 provides equal currents to each of the DUTs 34A, 34B, and 34C which are then compared with the current generated from the current generator 32A. The current mirroring circuit 92 is comprised of a PMOS transistor 94. A current flowing through the PMOS transistor 94 will vary with temperature. An NMOS transistor 96 which is coupled to the PMOS transistor 94 stabilizes the current and distributes the current to the DUTs 34A, 34B, and 34C, such that the gate to source voltage $V_{gs}$ of each of the DUTs 34A, 34B, and 34C is equal (i.e., $V_{BIAS}$ is equal for DUTs 34A, 34B, and 34C).

The present invention eliminates the limitations associated with prior art process control monitoring systems. Specifically, in the present invention, power dissipation is minimized by circuit architecture simplicity and a low device count. The low device count also reduces the cost associated for implementing the system as well as the amount of silicon real estate that is required in order to implement the system.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process control monitoring system comprising, in combination:

reference current source means for generating a stable reference current;

a plurality of differently weighted reference current source means coupled to said reference current source means for receiving said stable reference current and for generating a plurality of differently weighted reference currents;

a plurality of current comparator means each of said plurality of current comparator means having a variable input signal which varies with at least one of temperature, power supply voltage, and process changes and each of said plurality of current comparator means being individually coupled to a separate one of said plurality of differently weighted reference current source means for providing an output voltage corresponding to said differently weighted reference current source means coupled thereto and said variable input signal; and wherein each of said plurality of current comparator means is of a same process corner thus producing said output voltage for process control monitoring and correction.

2. A process control monitoring system in accordance with claim 1 further comprising a plurality of control signal means individually coupled to a separate output of each of said plurality of current comparator means for converting said output voltage of each of said current comparator means to a discrete control signal.

3. A process control monitoring system in accordance with claim 2 wherein each of said plurality of control signal means comprises a latching analog to digital converter means for reading said output voltage of said current comparator means coupled thereto and outputting said discrete control signal.

4. A process control monitoring system in accordance with claim 1 wherein said reference current source means comprises:

reference current generator means for generating said stable reference current, said stable reference current being process, temperature, and power supply voltage insensitive; and transistor means coupled to said reference current generator means for distributing said stable reference current to said plurality of differently weighted reference current source means.

5. A process control monitoring system in accordance with claim 4 wherein said reference current generator means generates said stable reference current having a current level of a nominal device.

6. A process control monitoring system in accordance with claim 1 wherein said plurality of current comparator means are NMOS transistors and said plurality of differently weighted reference current source means are PMOS transistors.

7. A process control monitoring system in accordance with claim 1 wherein said plurality of differently weighted reference current source means are weighted by a fixed ratio to said stable reference current wherein one of said plurality of differently weighted reference current source means supplies a nominal current flow and a remaining portion of said plurality of differently weighted reference current source means supply current flow in equal ranges above said nominal current flow and below said nominal current flow.

8. A process control monitoring system in accordance with claim 1 further comprising voltage biasing means coupled to each of said plurality of current comparator means for altering said variable input signal of each of said plurality of current comparator means as at least one of temperature, power supply voltage, and process changes vary.

9. A process control monitoring system in accordance with claim 8 wherein said voltage biasing means is a current mirroring circuit.

10. A process control monitoring system in accordance with claim 6 wherein said plurality of current comparator means are representative of and physically integrated into an integrated circuit.

11. A process control monitoring system in accordance with claim 10 wherein said plurality of differently weighted reference current source means are physically integrated into said integrated circuit.

12. A process control monitoring system in accordance with claim 3 wherein said plurality of control signal means are physically integrated into said integrated circuit.

13. A process control monitoring system in accordance with claim 11 wherein said reference current source means is physically integrated into said integrated circuit.

14. A process control monitoring system in accordance with claim 10 wherein said NMOS transistors which respond to different levels of said stable reference current for indicating electronic variations of said integrated circuit when transistors included in said integrated circuit are operating in saturation.

15. A process control monitoring system in accordance with claim 10 wherein said NMOS transistors which respond to different levels of said stable reference current for indicating electronic variations of said integrated circuit when transistors included in said integrated circuit are operating in at least one of a cut off state and a triode region.

16. A process control monitoring system in accordance with claim 1 wherein said plurality of current comparator means are PMOS transistors and said plurality of differently weighted reference current source means are NMOS transistors.

17. A process control monitoring system in accordance with claim 16 wherein said plurality of current comparator means are representative of and physically integrated into an integrated circuit.

18. A process control monitoring system in accordance with claim 17 wherein said PMOS transistors which respond to different levels of said stable reference current for indicating electronic variations of said integrated circuit when transistors included in said integrated circuit are operating in saturation.

19. A process control monitoring system in accordance with claim 17 wherein said PMOS transistors which respond to different levels of said stable reference current for indicating electronic variations of said integrated circuit when transistors included in said integrated circuit are operating in at least one of a cut off state and a triode region.

20. A process control monitoring system in accordance with claim 1 further comprising a plurality of cascode means each of said plurality of cascode means being individually coupled to a separate one of said plurality of current comparator means for increasing gain of said plurality of current comparator means to detect minute changes.

21. A process control monitoring system comprising, in combination:
reference current source means for generating a stable reference current;
a plurality of nominal current source means coupled to said reference current source means for receiving said stable reference current and for generating a plurality of reference currents;
a plurality of differently weighted current comparator means each of said plurality of differently weighted current comparator means having a variable input signal which varies with at least one of temperature, power supply voltage and process changes and which is individually coupled to a separate one of said plurality of nominal current source means for providing an output voltage corresponding to said nominal current source means coupled thereto and said variable input signal; and wherein each of said plurality of differently weighted current comparator means is of a same process corner thus producing said output voltage for process control monitoring and correction.

22. A process control monitoring system in accordance with claim 21 further comprising a plurality of control signal means individually coupled to a separate output of each of said plurality of differently weighted current comparator means for converting said output voltage of each of said differently weighted current comparator means to a discrete control signal.

23. A process control monitoring system in accordance with claim 22 wherein each of said plurality of control signal means comprises a latching analog to digital converter means for reading said output voltage of said differently weighted current comparator means coupled thereto and outputting said discrete control signal.

24. A process control monitoring system in accordance with claim 21 wherein said reference current source means comprises:
reference current generator means for generating said stable reference current, said stable reference current being process, temperature, and power supply voltage insensitive and said stable reference current having a current level of a nominal device; and
transistor means coupled to said reference current generator means for distributing said stable reference current to said plurality of nominal current source means.

25. A process control monitoring system in accordance with claim 22 wherein said plurality of differently weighted current comparator means are NMOS transistors and said plurality of nominal reference current source means are PMOS transistors.

26. A process control monitoring system in accordance with claim 21 further comprising biasing means coupled to each of said plurality of differently weighted current comparator means for altering said variable input signal of each of said plurality of differently weighted current comparator means as at least one of temperature, power supply voltage, and process changes vary.

27. A process control monitoring system in accordance with claim 26 wherein said plurality of differently weighted current comparator means are representative of and physically integrated into an integrated circuit.

28. A process control monitoring system in accordance with claim 27 wherein said plurality of nominal current source means are physically integrated into said integrated circuit.

29. A process control monitoring system in accordance with claim 23 wherein said plurality of control signal means are physically integrated into said integrated circuit.

30. A process control monitoring system in accordance with claim 28 wherein said reference current source means is physically integrated into said integrated circuit.

31. A process control monitoring system in accordance with claim 25 wherein said NMOS transistors which respond to different levels of said stable reference current for indicating electronic variations of said integrated circuit when transistors included in said integrated circuit are operating in saturation.

32. A process control monitoring system in accordance with claim 25 wherein said NMOS transistors which respond to different levels of said stable reference current for indicating electronic variations of said integrated circuit when transistors included in said integrated circuit are operating in at least one of a cut off state and a triode region.

33. A process control monitoring system in accordance with claim 23 wherein said plurality of differently weighted current comparator means are PMOS transistors and said plurality of nominal current source means are NMOS transistors.

34. A process control monitoring system in accordance with claim 33 wherein said PMOS transistors which respond to different levels of said stable reference current for indicating electronic variations of said integrated circuit when transistors included in said integrated circuit are operating in saturation.

35. A process control monitoring system in accordance with claim 21 further comprising a plurality of cascode means each of said plurality of cascode means being individually coupled to a separate one of said plurality of differently weighted current comparator means for increasing gain of said plurality of differently weighted current comparator means to detect minute changes.

36. A process control monitoring method comprising the steps of:
   generating a stable reference current from a reference current source;
   providing a plurality of differently weighted reference current source means coupled to said reference current source for receiving said stable reference current and for generating a plurality of differently weighted reference currents;
   providing a plurality of current comparator means each of said plurality of current comparator means having a variable input signal which varies with at least one of temperature, power supply voltage, and process changes and each of said plurality of current comparator means being individually coupled to a separate one of said plurality of differently weighted reference current source means for providing an output voltage corresponding to said weighted reference current source means coupled thereto and said variable input signal; and
   wherein each of said plurality of current comparator means is of a same process corner thus producing said output voltage for process control monitoring and correction.

37. The method of claim 36 further comprising the step of providing a plurality of control signal means individually coupled to a separate output of each of said plurality of current comparator means for converting said output voltage of each of said current comparator means to a discrete control signal.

38. A process control monitoring method comprising the step of:
   generating a stable reference current from a reference current source;
   providing a plurality of nominal current source means coupled to said reference current source for receiving said stable reference current and for generating a plurality of reference currents;
   providing a plurality of differently weighted current comparator means each of said plurality of differently weighted current comparator means having a variable input signal which varies with at least one of temperature, power supply voltage, and process changes and each of said plurality of differently weighted current comparator means being individually coupled to a separate one of said plurality of nominal current source means for providing an output voltage corresponding to said nominal current source means coupled thereto and said variable input signal; and
   wherein each of said plurality of differently weighted current comparator means is of a same process corner thus producing said output voltage for process control monitoring and correction.

39. The method of claim 38 further comprising the step of providing a plurality of control signal means individually coupled to a separate output of each of said plurality of weighted current comparator means for converting said output voltage of each of said weighted current comparator means to a discrete control signal.

* * * * *